(12) United States Patent
Mueller (10) Patent No.: US 6,210,487 B1
(45) Date of Patent: Apr. 3, 2001

(54) DISPOSABLE SEAL SYSTEM WITH INTEGRAL BUFFER

(75) Inventor: Peter Michael Mueller, Suwanee, GA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/383,780

(22) Filed: Aug. 26, 1999

(51) Int. Cl.[7] .................................................. C23C 16/00
(52) U.S. Cl. ............................................ 118/733; 118/718
(58) Field of Search ................................ 118/733, 715, 118/718

(56) References Cited

U.S. PATENT DOCUMENTS

| | | | |
|---|---|---|---|
| 4,217,027 | 8/1980 | MacChesney et al. | 350/96.3 |
| 4,347,069 | * 8/1982 | Haney et al. | 65/417 |
| 4,793,842 | * 12/1988 | Yokota et al. | 65/397 |
| 4,820,322 | * 4/1989 | Baumgart et al. | 65/412 |
| 6,105,396 | * 8/2000 | Glodis et al. | 65/377 |

* cited by examiner

*Primary Examiner*—Jeffrie R. Lund
*Assistant Examiner*—Sylvia R. MacArthur (57) ABSTRACT

A sealing arrangement for use in a gas delivery system to a rotating tubular member has first and second disposable seals spaced apart to form a sealed buffer zone within the rotating tube. A supply coupling is connectable to a source of buffer gas and has an insert member which has one or more channels for routing the buffer gas into the buffer zone. The supply coupling is also connectable to a low pressure source and the insert member has one or more channels for routing the gases contained in the buffer zone out of the zone to the supply coupling, thus creating a continuous circulation of buffer gases.

28 Claims, 6 Drawing Sheets

DISPOSABLE SEAL SYSTEM WITH INTEGRAL BUFFER

RELATED APPLICATIONS

This invention is related to that shown in U.S. patent application Ser. No. 09/383,716 of M. Mueller filed concurrently herewith, the disclosure thereof being incorporated herein by reference.

FIELD OF THE INVENTION

This invention relates to a sealing apparatus for chemical delivery systems and, more particularly, to the process of introducing materials into the interior of rotating tubular members, wherein the apparatus forms a buffer zone for controlling leakage.

BACKGROUND OF THE INVENTION

The following discussion deals with starter tubes and sealing arrangements for optical fiber pre-forms, but it is to be understood that principles of the present invention are applicable to other, different applications involving, generally, chemical delivery systems wherein the chemicals are in gaseous or vapor form.

Optical fiber of the type used to carry optical signals is fabricated typically by heating and drawing a portion of an optical pre-form comprising a refractive core surrounded by a protective glass cladding. Presently, there are several known processes for fabricating pre-forms. The modified chemical vapor disposition (MCVD) process, which is described in U.S. Pat. No. 4,217,027 issued in the names of J. B. MacChensey et al. on Aug. 12, 1980 and assigned to Bell Laboratories, Inc. has been found to be one of the most useful because the process enables large scale production of pre-forms which yield very low loss optical fiber.

During the fabrication of pre-forms by the MCVD process, reactant-containing gases, such as $SiCL_4$ are passed through a rotating substrate tube which is made of silica glass. A torch heats the tube from the outside as the precursor gases are passed therethrough, causing deposition of submicron-sized glass particles on the inside surface of the tube. The torch is moved along the longitudinal axis of the tube in a plurality of passes to build up layer upon layer of glass to provide a pre-form tube. Once a sufficient number of layers have been deposited, the pre-form tube is then heated to cause it to be collapsed to yield a pre-form or pre-form rod as it is often called. The delivery system of the reactant gases to the starter tube interior is generally through a fixed metallic hollow tube connected to the source or sources of the gases. It is necessary that the space between the exterior surface of the delivery tube and the interior surface of the glass starter tube be sealed so that the critical gases do not leak out of the starter tube.

In the current method of manufacture, the apparatus which ensures sealed delivery of the deposition chemicals in the gases is a combination of a rotary union element, a structure for holding and sealing the starter tube, and a secondary face seal assembly for routing of purge gases through the structure. This is a complex apparatus that requires frequent maintenance. Existing systems also have the disadvantage of having inherently larger cavities for the accumulation of dead zones of flow, and a tendency to create particle contamination from the rotary union and face seal system. Inasmuch as the chemical delivery system is stationary, the current means of achieving delivery is via the rotary union, featuring a transition of the chemicals from a stationary pipe to a rotary pipe or to the inside of a supply coupling. The chemicals being delivered are at a pressure greater than atmospheric, and the face seal properties are the only restriction to the release of the chemicals to the atmosphere. The rotary union and secondary face seals generate a large quantity of particles from wear, and contribute to the contamination of the coupling. As the seals wear down, excessive leakage occurs both to the atmosphere and into the product (starter tube), resulting in lost product and requiring system maintenance. The complexity of the components involved requires skilled maintenance being performed using requalification through test of the system. Both material and labor costs are, consequently, high.

Present day techniques and apparatus provide a buffer zone of gas/liquid between the chemical being delivered into the atmosphere. The buffer zone provides for a controlled environment, which may be regulated to pressures higher or lower than the surrounding chemical being delivered and higher/lower than the atmosphere. Selection of this buffer zone pressure and constituent gas/liquid in this zone controls the leakage directions and the leakage constituents across the seals. In a typical buffered sealing system, the buffered volume is achieved most simply by having a single internal seal and a single external seal connected via a housing which is fixed relative to the rotating member to be sealed. The introduction passage and the removal passage are then connected through the housing to the buffer volume.

In the aforementioned Mueller patent application Ser. No. 09/383,716, there is shown a sealing system that eliminates many drawbacks characteristic of prior art delivery systems, as enumerated in that application, such as, for example, the rotary union, by internally sealing the starter tube by means of a self tightening seal and mounting arrangement therefor. The basis of such the arrangement of that application requires a constant rotational capability of the mounting hub for the self tightening feature, which conflicts with the need for fixed connections to the buffer zone of the introduction and removal lines. Inasmuch as supply lines cannot be connected directly to the components of the Mueller arrangement, the advantages to be gained through the use of disposable, self-tightening seals would appear to be unrealizable.

SUMMARY OF THE INVENTION

The present invention is a dual internal seal system which makes use of a disposable seal arrangement, such as is shown and described in the aforementioned Mueller application Ser. No. 09/383,716.

In the preferred embodiment of the invention, the system is for use with a stationary chemical supply apparatus including a stationary delivery tube having a first end upon which is mounted a supply coupling having an extension inserted into the starter tube of an optical pre-form starter tube. A primary seal is mounted to the first end of the extension tube and functions to seal the interior of the starter tube from the atmosphere or ambient environment, thus preventing leakage loss of the chemical vapor introduced therein through the extension tube. A secondary seal, also mounted on the delivery tube, is spaced from the primary seal to form a buffer zone between the two seals. A supply coupling receives oxygen, for example, from a controllable pressure source, and introduces it into the buffer zone between the two seals. The supply coupling also is connected to a vacuum source for exhausting the gas mixture from the buffer zone, thereby creating a continuous gas flow.

In greater detail, the supply coupling is composed of two parts, a housing member and an insert member. The insert member has a plurality of longitudinal channels formed in the outer surface thereof, circumferentially spaced from each other. A first group of channels, e.g. three, are joined at the forward ends and at their rear ends by circumferential manifold channels, and a second group of channels is likewise so joined. However, the first group of channels is totally isolated from the second group. The housing member is bored at its rear end to form a passage for oxygen or buffer gas supply, there being a horizontal input bore and a vertical bore communicating therewith. A second horizontal and vertical bore in the housing connects to a vacuum source. By vacuum source is meant a low pressure source which, as will be discussed more fully hereinafter, functions to draw the gas mixture out of the buffer zone. The insert member, which is sized to be a press fit within a central bore of the housing is oriented so that the first group of interconnected channels are oriented to communicate with the vertical bore in the housing that is connected, through its corresponding horizontal bore, to the buffer gas supply. Such an orientation places the second group of interconnected channels in position to communicate with the exhaust or vacuum bores in the housing.

The housing includes a bored extension within which the insert is contained, which has a forward end having a shoulder against which the hub of a conically shaped secondary sealing member bears, and a portion of the first and second groups of channels extend beyond this shoulder and the seal, when in place against the shoulder. By "forward" is meant that portion of the member closer to the starter tube relative to the "rearward" portion. The housing and the insert are mounted on the delivery end of the delivery tube by press fit, threads, bayonet lock, or the like, the press fit being preferred, and the buffer gas delivery and the exhaust or vacuum connections are made thereof.

The secondary sealing member is held in place against the shoulder of the housing member by a secondary seal nut which is mounted on the protruding end of the insert. As discussed in the aforementioned Mueller application Ser. No. 09/383,716, the mounting means may take any of a number of forms, however, a preferred arrangement is a threaded end on the insert and interior threads in the secondary seal nut. Also as explained in the Mueller application, the direction of the threads, i.e., left hand or right hand, should be the same as the direction of rotation of the starter tube in order to apply a tightening torque to the seal and to the secondary seal nut. The same constraint applies to other types of fastening or mountings which require a twisting or turning action, such as, for example, bayonet mounts. The secondary seal nut has an extended portion with, for example, a threaded end, and a shoulder against which a primary seal butts and is held in place by a primary seal nut. The primary and secondary conical seals are longitudinally spaced and, in use, form a buffer zone that is sealed by the primary seal from the starter tube interior, and, by the secondary seal from the atmosphere. The end of the secondary seal nut which bears against the hub of the conical sealing member has a plurality of openings or slots circumferentially spaced about the perimeter for providing passages into the buffer zone for the first and second groups of channels.

In use, the oxygen or other buffer gas or liquid is introduced under regulated pressure into the supply coupling housing and distributed by the first group of channels to the buffer zone. The buffer zone gases, which may include some leakage from the starter tube, are exhausted through the second group of channels to the vacuum apparatus coupling. Thus, there is a constant circulation of gaseous/liquid material through the buffer zone which, as discussed hereinbefore, makes possible a controlled environment, control over leakage, cooling of the apparatus, and removal of contaminants or other unwanted materials. These desiderata are realized in a reality simple apparatus having replaceable seals without the necessity of disturbing or piercing the seals.

These and other features and advantages of the present invention will be readily apparent from the following detailed description, read in conjunction with the accompanying drawings.

DETAILED DESCRIPTION

In the fabrication of the pre-form for drawing clad glass fibers, generally, gas plane precursor reactants together with oxygen are introduced into a glass tube, i.e., a starter tube in a constantly moving stream. The tube and its contents are heated to a homogenous reaction temperature within a moving hot zone produced by a moving heating element which continuously transverses the outside surface of the tube. Homogeneously produced glass particles, commonly called "soot" collect on the tube walls, and are fused into a continuous layer within the moving hot zone. In the modified vapor deposition (MCVD) process shown and described in the aforementioned MacChesney et al U.S. Pat. No. 4,217,027, the tube is continuously rotated about its longitudinal axis.

Figure 1:
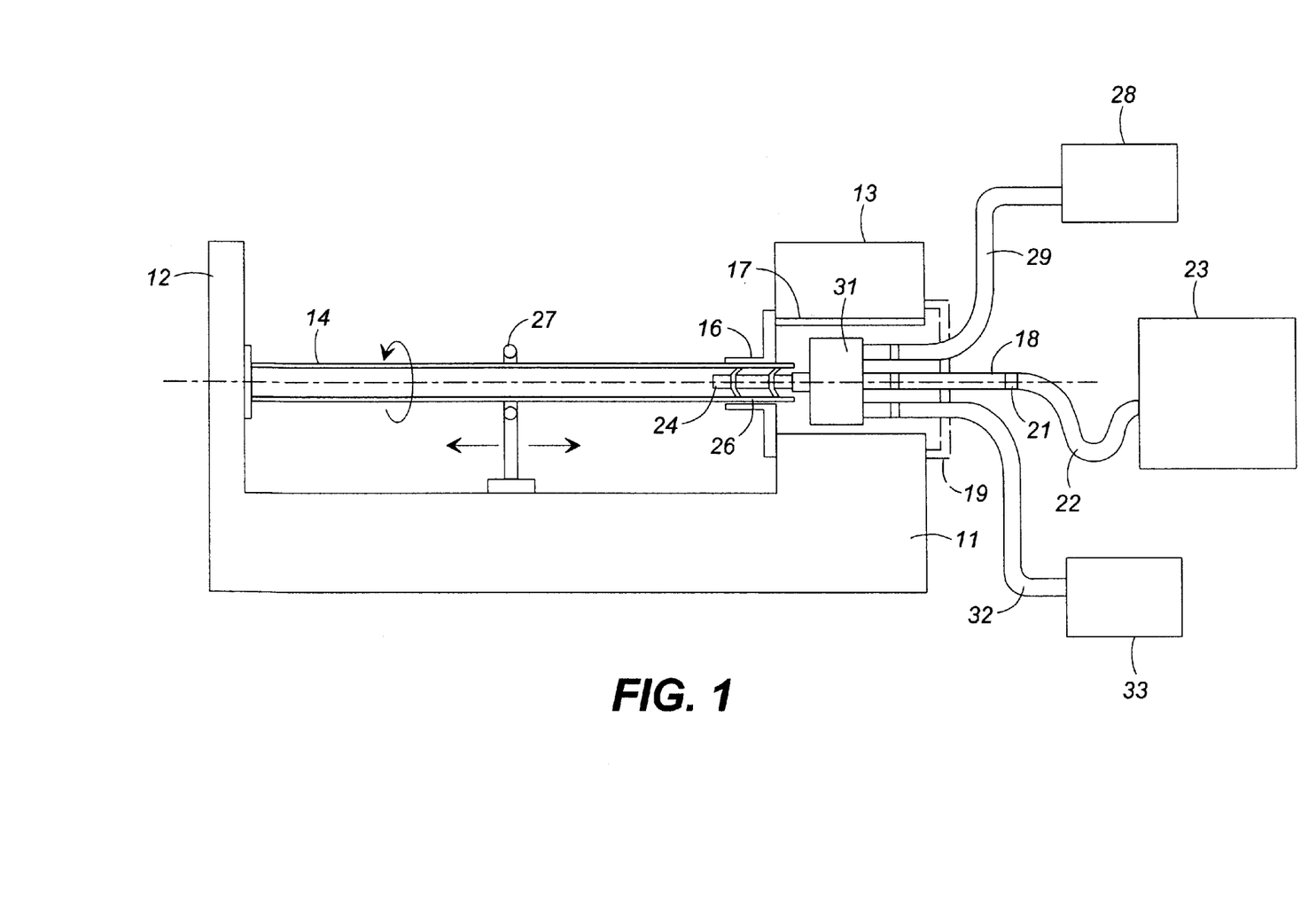
FIG. 1 is a diagrammatic view of the apparatus for introducing gaseous elements into a starter tube and using the sealing arrangement of the present invention.

FIG. 1 is a diagrammatic view of the apparatus for preparing preforms as just discussed, and showing the sealing arrangement of the present invention. A lathe 11 has axially disposed between a tailstock 12 and a headstock 13 a starter tube 14. Tube 14 is mounted in an arbor 16 having a cylindrical or hollow shaft 17 and which is driven by means not shown, but generally contained within the headstock, to rotate tube 14 in the direction of the arrow. It is to be understood that rotation may be clockwise or counterclockwise. For the following discussion, it will be assumed that the direction of rotation is counter-clockwise as viewed from tailstock 12 toward headstock 13. Within the arbor shaft 17 is a stationary delivery tube 18, the stationary mounting arrangement for the tube being shown diagrammatically as mounting element 19, which may take any of a number of forms. Delivery tube 18 is shown with a protruding end 21 which is coupled by a conduit 22 to a source 23 of the gaseous materials. Tube 18 intrudes into the end of starter tube 14 and has, at its intruding end 24 the sealing arrangement 26 of the invention, to be discussed more fully hereinafter. Sealing arrangement 26 is, in accordance with the invention, self tightening, i.e., as tube 14 rotates, it tightens the sealing arrangement 26 to insure maintenance of a seal with tube 14 that prevents the gases in tube 14 from leaking out. A heat or flame source 27 is movably mounted within lathe 11 for back-and-forth traversal of the length of tube 14, as discussed hereinbefore, and as indicated by the arrows.

Buffer zone gas, such as oxygen, or a mixture of suitable gases is supplied from a controllable pressure source 28 through conduit 29 to a supply coupling housing 31 and to the buffer zone of the sealing arrangement 26 in a manner to be discussed in detail hereinafter. Also connected to the buffer zone through housing 31 and conduit 32 is a low pressure or vacuum source 33. It is to be understood that the system of the invention is shown diagrammatically in FIG. 1, which is not intended to illustrate the relative sizes and orientations of the various components.

Figure 2:
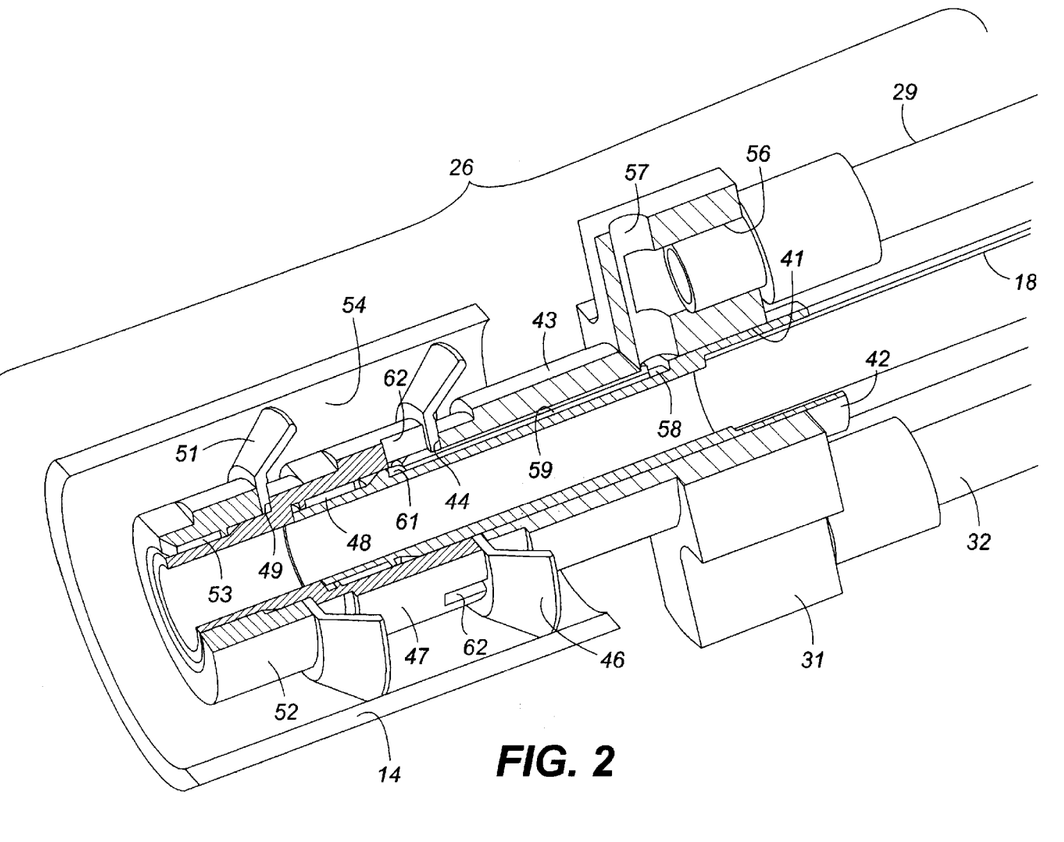
FIG. 2 is a perspective, partially sectional view of the buffer zone sealing apparatus of the present invention.

FIG. 2 is a perspective, partially cross-sectional view of the sealing arrangement 26 of the present invention. As can be seen in FIG. 2, housing 31, of the supply coupling member, has a bore 41 which contains an insert member 42 which is affixed to delivery tube 18 by suitable means, such as a press fit or, where practical, mating threads. Insert member 42 is, preferably, a press fit in bore 41 of housing member 31, although other means may be used, such as mating threads, bayonet lock, or the like. With insert 42 mounted on delivery tube 18, which is stationary, the housing 31 is also stationary, as is insert 42. Housing member 31 has an extension 43 ending, at its forward end, in a shoulder 44 against which a conically shaped secondary sealing member 46 bears. Sealing member 46 is held in place by a secondary sealing nut 47 which, preferably, is threaded onto the forward end of insert 42 at the region 48. As discussed in the foregoing, means other than threads, such as bayonet lock, may be used to affix nut 47 to insert 42. Inasmuch as, in operation, sealing member 46 is stationary while starter tube 14 is rotated by the arbor 16, not shown in FIG. 2, the tightening direction of rotation of nut 47 is in the same direction as the direction of rotation of tube 14. Thus, a counterclockwise rotation of tube 14 dictates a left hand thread, for example, in the mounting 48 to insure self-tightening of nut 47 through the torque applied to sealing member 46 by rotating tube 14.

Secondary sealing nut 47 has a shoulder 49 formed thereon against which a primary sealing member 51 bears, which is held in place by a primary sealing nut 52, threaded or otherwise mounted on the forward end of secondary sealing nut 47 in region 53. In order that nut 52 and sealing member 51 be self tightening during operation, the threads or other mounting means should have a rotational direction of tightening that is the same as the direction of rotation of starter tube 14. In that case, the torque applied to sealing member 51 is transmitted to nut 52, which is, consequently, subjected to a tightening torque. Thus, for counter-clockwise rotation of tube 14, the tightening direction is left hand.

The region 54 between sealing members 46 and 51 is a buffer zone which is sealed by member 51 from the interior of tube 14, to which gases are fed through delivery tube 18, hollow insert 42, and hollow secondary sealing nut 47, sealing nut 52 being open ended. Region 54 is also sealed from the atmosphere by secondary sealing member 46. Inasmuch as, over time, there will be some leakage around sealing member 51, the buffer zone 54 is used to control, at least to some extent, the amount of leakage by means of the gas pressure within zone 54, which is introduced therein from controllable pressure source 28. Likewise, in order to prevent an accumulation of leaked matter, which generally will be gaseous with some particulate matter, region 54 is continuously flushed. In order that the introduction and removal of gases from zone 54 be accomplished without disturbance of the seals 46 and 51, housing member 31 has a first bore 56 therein which is connected to, and receives gases from, conduit 29. A second bore 57 communicates with bore 56 and with a manifold groove 58 formed peripherally on insert member 42. Manifold groove 58 opens into three longitudinally extending channels 59 (only one of which is shown) which constitute a first group of channels. Channels 59 terminate in a second manifold groove 61 formed peripherally on insert member 42 in a region that is within zone 54 between sealing members 46 and 51. In order that manifold groove 61 communicate with zone 54, nut 47 has a plurality of slots or notches 62 which are circumferentially spaced around nut 47 at the rear end thereof which butts against sealing member 46. The spacing of the slots 62 is such that one or more of the slots always provides an opening into the zone 54 for manifold groove 61, regardless of the rotational position of nut 47. As will be illustrated hereinafter, a second group of channels, isolated from the first group, communicate at each end to manifold slots which allow outflow from zone 54 of the gases and impurities therein.

With the construction shown in FIG. 2, which tube 14 is rotating and the delivery tube 18 delivers the gases or mixture for fabricating the pre-form, buffer gases, under regulated pressure, are delivered to and exhausted from the sealed buffer zone 54. The buffer zone thus provides for a controlled environment, which may be regulated to pressures higher or lower than the chemicals being delivered to the tube 14 and higher or lower than the atmosphere. Selection of the buffer zone pressure controls the leakage direction and the leakage constituents across the seals. Thus, the seal system of the invention provides for low cost, low maintenance, greater cleanliness, and cooling wherein the internal seals and associated components are self-tightening and easily and quickly replaceable.

Figure 3:
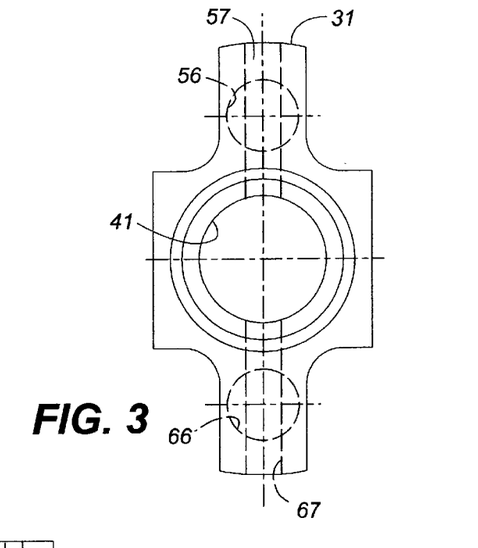
FIG. 3 is a front elevation view of the supply coupling housing member.
Figure 4:
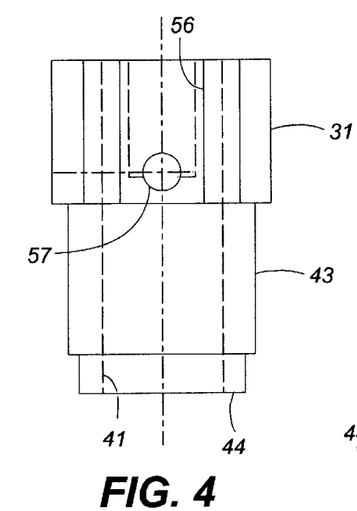
FIG. 4 is a top plan view of the housing of FIG. 3.
Figure 5:
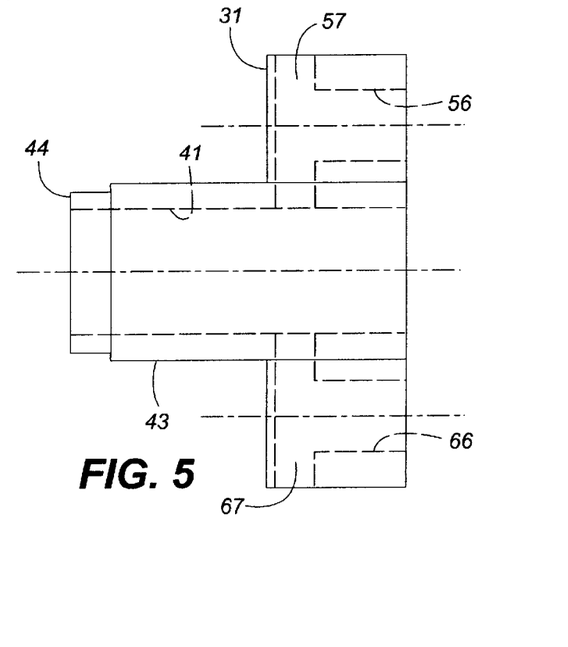
FIG. 5 is a side elevation view of the housing of FIG. 3.

FIGS. 3, 4, and 5 are, respectively, a front elevation view, a top plan view, and a side elevation view of the supply coupling housing 31. Housing 31 has a central bore 41 for receiving the insert 42 which is, preferably, a press fit therein, although other means such as threading, brazing, or welding might be used. Communicating with bore 41 is a vertical bore 57 which also is in communication coupling to a horizontal bore 56. For purposes of this discussion, bores 56 and 57 are considered to be buffer gas inputs, while bores 66 and 67 are considered to be buffer gas outputs. However, bores 56 and 57 may be the outputs and bores 66 and 67 may be the inputs. According to the convention adopted, bore 56 is connectable to conduit 29 from gas supply 28, and bore 66 is connectable to conduit 32, from low pressure or vacuum supply 33. As best seen in FIGS. 4 and 5, housing 31 has an extended portion 43 with the forward end 44 forming a butting shoulder for the secondary sealing member 46. It is not necessary that there be horizontal bore 56 and a vertical bore 57 if one single bore can serve the purpose. Bores 56 and 57 are shown here merely as examples, but it is also possible to use radial bores, or angled bores.

Figure 6:
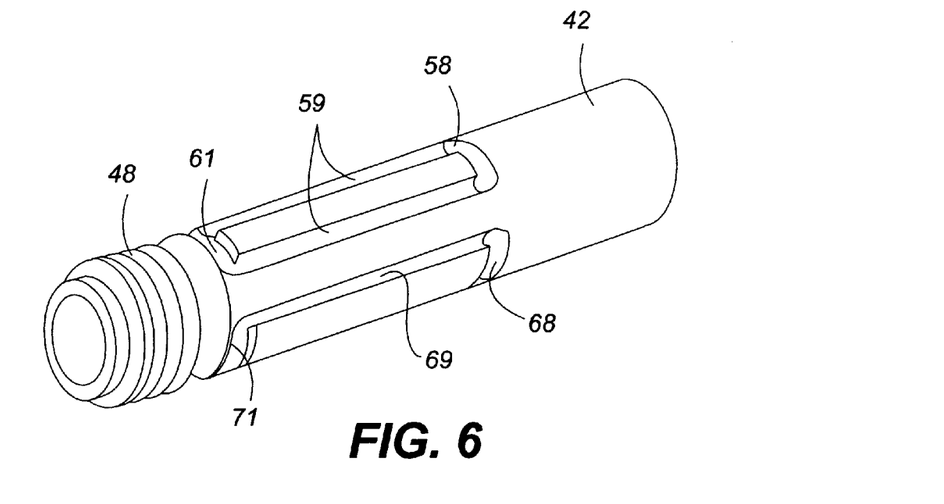
FIG. 6 is a perspective view of the insert member for use with the housing of FIG. 3.
Figure 7:
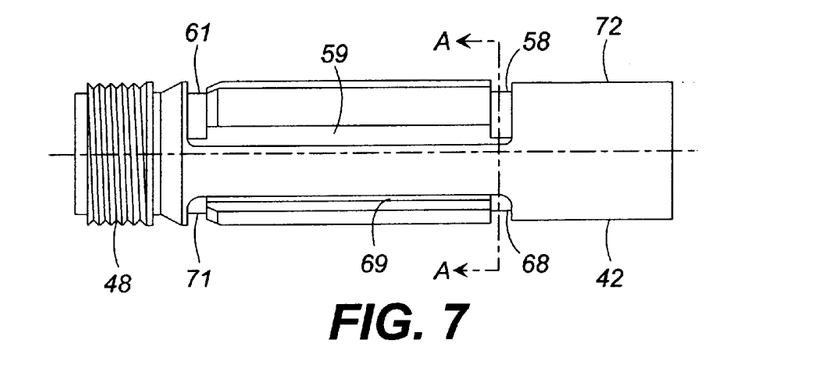
FIG. 7 is a side elevation view of the insert member of FIG. 6.
Figure 8:
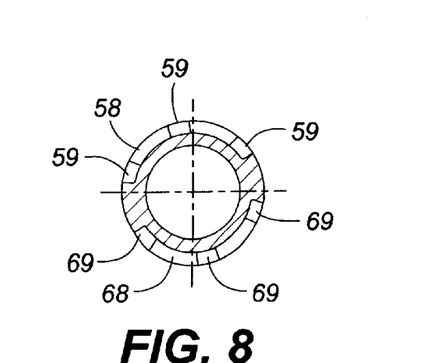
FIG. 8 is a cross-sectional view of the insert taken along the line A—A of FIG. 7.

FIG. 6 is a perspective view of the insert member 42 which is adapted to be a press fit within bore 41 of housing 31, although other suitable means such as brazing, welding, or threads might possibly be used to affix insert 42 to housing 31. FIG. 7 is a side elevation view of member 42, and FIG. 8 is a cross sectional view along the line A—A of FIG. 7. It can best be seen in FIG. 6 that manifold grooves 58 and 61 function as distributor and collector respectively of the buffer gas mixture to and from longitudinal channels 59, the first group of channels. In addition, there is a waste gas distributor manifold groove 71 and a waste gas collector manifold groove 68 for the second group of channels 69. It should be noted that the first group of channels 59 and 61 are completely isolated from the second group of channels 69 and their manifold grooves 68 and 71. Thus, using the convention adopted, channels 59 transmit the buffer gas mixture to buffer zone 54, and channels 69 transmit waste gases out of and away from the buffer zone 54. As previously discussed, the end 72 of insert 42 is adapted to receive and to be affixed to the forward end of delivery tube 18, and the forward end preferably has threads 48 thereon for receiving secondary sealing nut 47.

Figure 9:
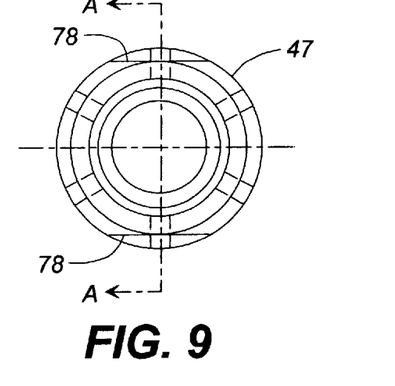
FIG. 9 is a front elevation view of the secondary sealing nut of the invention.
Figure 10:
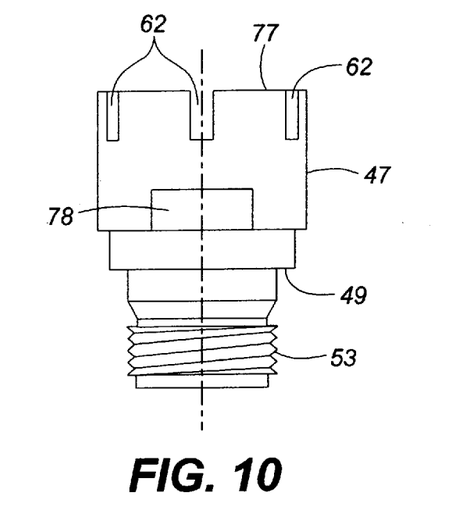
FIG. 10 is a top plan view of the nut of FIG. 9.
Figure 11:
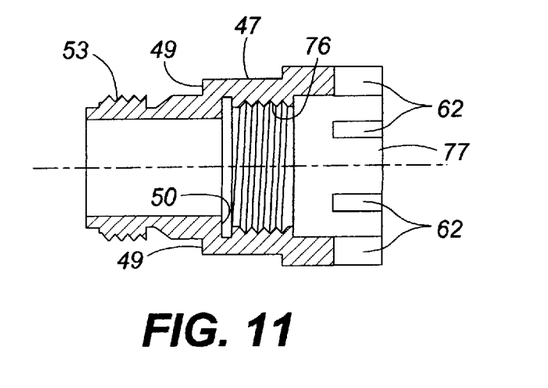
FIG. 11 is a side cross-section of the secondary sealing nut taken along the line A—A of FIG. 9.

FIG. 9 is a front elevation view of secondary sealing nut 47, FIG. 10 is a top plan view thereof, and FIG. 11 is a cross-sectional view along the lines A—A of FIG. 9. As best seen in FIG. 1, nut 47 has internal threads 76 which mate with threads 48 on insert 42 for mounting thereon. As best seen in FIG. 2, the rear end 77 of nut 47 bears against the hub of secondary seal 46 to press it against shoulder 44 of housing extension 43, thereby affixing it in place. In addition, and as discussed hereinbefore, end 77 has slots 62 for permitting passage of gases into and out of buffer zone 54. For ease of initial installation, nut 47 has flats 78 on the outer surface thereof to provide purchase for a wrench, for example. Instead of slots 62, radial holes may be used in which case the entire end face of nut 47 can bear against secondary sealing member 46.

At the inner end of the threads 76 is an O-ring recess 50 where an O-ring may be inserted to prevent further leakage.

Figure 12:
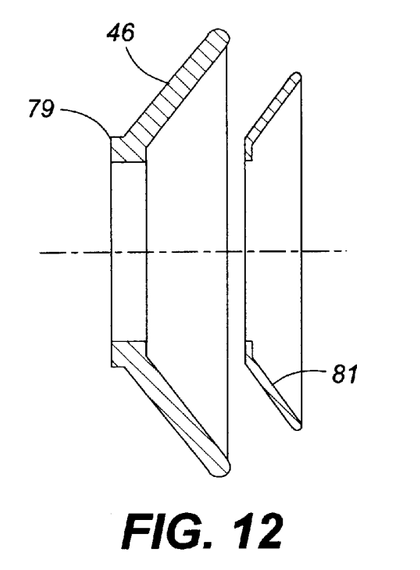
FIG. 12 is a cross-sectional side elevation view of the sealing member of the invention.

Both the primary sealing member 51 and the secondary sealing member 46 are configured as shown in FIG. 12. The sealing member 46, 51 is conically shaped and has a hub portion 79 adapted to butt against shoulders 44 and 49 and against which nuts 47 and/or 52 bear. Also shown in FIG. 12 is a conically shaped resilient member 81 which may be, for example, a leaf spring which applies restoring force to member 46 or 51. The sealing member 41,51 is made from any of a number of suitable materials such as, for example, hard rubber. It has been found that Teflon® is an excellent material, having a degree of flexibility and a high resistance to wear.

Figure 13:
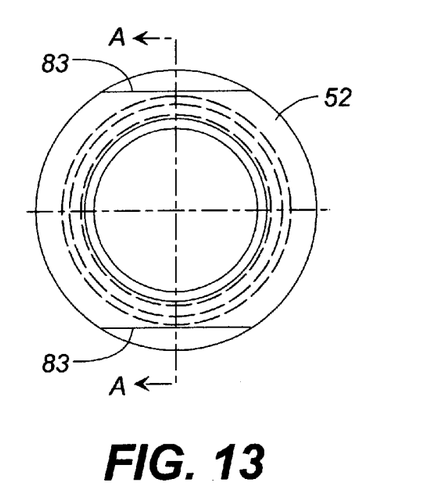
FIG. 13 is a front elevation view of the primary sealing nut of the invention.
Figure 14:
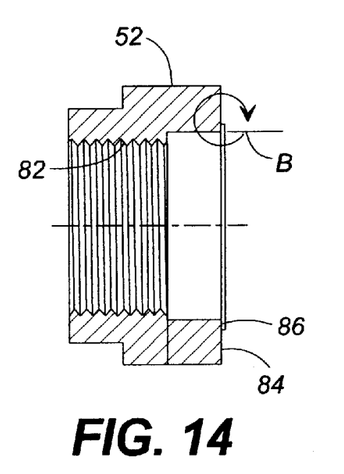
FIG. 14 is a cross-section of the primary sealing nut taken along the line A—A of FIG. 13.
Figure 15:
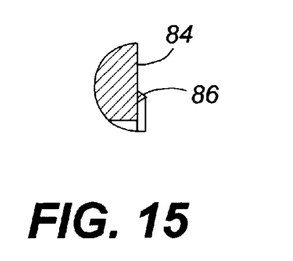
FIG. 15 is a detail taken from the circle B of FIG. 14.

FIG. 13 is a front elevation view of primary sealing nut 52 which has internal threads 82 which mate with threads 53 on secondary sealing nut 47, which, as pointed out hereinbefore, have a tightening direction of rotation the same as the direction of rotation of tube 14, e.g., counter-clockwise or left hand. Thus, nut 52, during operation, is continuously subjected to a tightening torque in the same manner as nut 47. Nut 52 has a pair of flats 83 on the exterior thereof for facilitating initial installation. The rear face 84 of nut 52 is adapted to bear against the sealing member 51 as discussed in the foregoing, thereby sandwiching member 51 between shoulder 49 on secondary sealing nut 47 and face 84. FIG. 15 is a detail of face 84, taken in circle B of FIG. 14, and showing the configuration of a circular ridge 86 on face 84, which, when nut 52 is tightened against member 51, imparts distortion to member 51 to enhance its sealing characteristic, as explained in the aforementioned Mueller application Ser. No. 09/383,716. Distorting member 86, instead of being of circular ridge, can be one or more spaced straight ridges extending radially on face 84. Such a structure would have the additional advantage of increasing the friction between face 84 and member 51. The ridge 86 or an equivalent may also be used on nut 47 when holes are used as the passageways instead of slots 62.

The various components of the sealing system of the present invention may be fabricated from any of a number of suitable materials. Thus, housing 31, insert 42, secondary sealing nut 47 and primary sealing nut 52 may all be made of stainless steel, especially because of its durability and resistance to the chemicals used in the process. However, one or more of the components may be made of a suitable hard plastic which is resistant to the chemicals. Plastic components may be cast to shape and easily machined compared to stainless steel, however, they lack the durability of steel or other suitable metals. In those instances where threads are used, it is feasible to use O-rings to prevent the threads from being a source of leakage.

The sealing arrangement of the present invention utilizes the advantages of the self-tightening disposable, internal seals as shown in the Mueller application Ser. No. 09/383, 716, while creating a buffer zone and supplying it with the desired gases or chemicals, without interfering with the sealing action of the seals.

In conclusion, it should be noted that it will be obvious to those skilled in the art that many variations and modifications may be made to the preferred embodiment or embodiments without departure from the principles of the present invention. All such variations and modifications are intended to be included herein as being within the scope of the present invention. Further, in the claims hereafter, the corresponding structure, materials, acts, and equivalents of all means or step plus function elements are intended to include any structures, materials, or acts for performing the functions with other specifically claimed elements.

What is claimed is:

1. For use in a chemical delivery system to a rotating tubular member having a stationary delivery tube, a sealing arrangement for sealing the tubular member to control chemical leakage, said sealing arrangement comprising:

a supply coupling member having a first extension thereon having a first end insertable into the tubular member and having a bore for passage of the chemicals being supplied to the tubular member;

a secondary sealing member mounted on said first extension spaced from said first end and having a diameter such that it is adapted to make sealing engagement with the inner wall of the tubular member;

a secondary sealing nut mounted on said first extension for holding said secondary sealing member on said first extension, said secondary nut having a second extension thereon having a first end adapted to bear against said secondary sealing member and a second end;

a primary sealing member mounted on said second extension of said secondary nut intermediate the first and second ends thereof, said primary sealing member having a diameter such that it is adapted to make sealing engagement with the inner wall of the tubular member;

said primary sealing member being spaced from said secondary sealing member to create a sealed buffer zone therebetween;

a primary sealing nut mounted on said second end of said second extension on said secondary sealing nut for holding said primary sealing member on said second extension;

said secondary sealing nut and said primary sealing nut each having a direction of rotation for tightening which is the same as the direction of rotation of said tubular member.

2. A sealing arrangement as claimed in claim 1 wherein said first end of said first extension extends into said buffer zone between said primary and secondary sealing members.

3. A sealing arrangement as claimed in claim 2 wherein said supply coupling member has a first chemical passageway therein and said first extension has a second chemical passageway therein in communication with said first chemical passageway and having a first end extending into said buffer zone.

4. A sealing arrangement as claimed in claim 3 wherein said supply coupling member has a third chemical passageway therein and said first extension has a fourth chemical passageway therein in communication with said third chemical passageway and having a first end extending into said buffer zone.

5. A sealing arrangement as claimed in claim 4 wherein said second and said fourth passageways are spaced and isolated from each other.

6. A sealing arrangement as claimed in claim 4 wherein said first passageway is connectable to a source of pressure controlled buffer gases.

7. A sealing arrangement as claimed in claim 4 wherein said third passageway is connectable to a low pressure source.

8. A sealing arrangement as claimed in claim 4 wherein said first extension has a plurality of spaced second chemical passageways having first and second ends, said second passageway being interconnected by first and second manifold passageways in said first extension at each of said first and second ends respectively.

9. A sealing arrangement as claimed in claim 8 wherein said first extension has a plurality of spaced fourth chemical passageway having first and second ends, said fourth passageways being interconnected by a third and fourth manifold passageways in said first extension at each of said first and second ends respectively.

10. A sealing arrangement as claimed in claim 9 wherein said first end of said secondary sealing nut has a plurality of radial passageways therein communicating with said first manifold passageway and communicating with said third manifold passageway.

11. A sealing arrangement as claimed in claim 10 wherein said passageways are radial slots in said first end of said secondary sealing nut.

12. A sealing arrangement as claimed in claim 10 wherein said passageways are radial holes adjacent said first end.

13. A sealing arrangement as claimed in claim 12 wherein said first end has an end face with a distorting member thereon for imparting distortion to said secondary sealing member.

14. A sealing arrangement as claimed in claim 9 wherein said first chemical passageway in said supply coupling member communicates with said second manifold passageway.

15. A sealing arrangement as claimed in claim 9 wherein said third chemical passageway in said supply coupling member communicates with said fourth manifold passageway.

16. A sealing arrangement as claimed in claim 4 wherein said first end of said secondary sealing nut has a first radial passageway therein communicating with said first end of said second chemical passageway in said buffer zone.

17. A seating arrangement as claimed in claim 4 wherein said first end of said secondary sealing nut has a second radial passageway therein communicating with said first end of said fourth chemical passageway in said buffer zone.

18. A sealing arrangement as claimed in claim 1 wherein said primary sealing nut has an end face that bears against said primary sealing member.

19. A sealing arrangement as claimed in claim 18 wherein said end face has a distorting member thereon for imparting distortion to said primary sealing member.

20. A sealing arrangement as claimed in claim 19 wherein said distorting member is a ridge.

21. A sealing member as claimed in claim 20 wherein said ridge is circular.

22. A sealing arrangement as claimed in claim 18 wherein said first and second sealing members are in the shape of a truncated cone.

23. A sealing arrangement as claimed in claim 18 wherein said first and second sealing members are made of Teflon®.

24. A sealing arrangement as claimed in claim 1 wherein said supply coupling member is made of a chemical resistant material.

25. A sealing arrangement as claimed in claim 24 wherein said chemical resistant material is stainless steel.

26. A sealing system for a gas delivery system for delivering gas to a rotating tubular member, said sealing system comprising:

a gas delivery tube having a forward end;

a sealing system mounted on said forward end and axially aligned therewith comprising a first sealing member for making sealing contact with the interior of the tubular member;

a second sealing member axially spaced from said first sealing member for making sealing contact with the interior of the tubular member;

the space between said first and second sealing member comprising a buffer zone; and gas conduit means mounted on said delivery tube for creating a circulation of buffer gas into and out of said buffer zone.

27. A sealing system as claimed in claim 26 wherein said gas conduit means comprises a supply coupling member having a first channel connected to a source of the buffer gas, said first channel extending from said supply coupling member into said buffer zone.

28. A sealing system as claimed in claim 27 wherein said gas conduit means further comprises a second channel in said supply coupling member connected to a low pressure source, said second channel extending from said supply coupling member into said buffer zone.

* * * * *